(12) United States Patent
Kuang et al.

(10) Patent No.: US 9,357,664 B2
(45) Date of Patent: May 31, 2016

(54) PORTABLE TERMINAL

(75) Inventors: Kunshan Kuang, Shenzhen (CN); Chunhai Ma, Shenzhen (CN)

(73) Assignee: Hytera Communications Corp., Ltd., Shenzhen, Guangdong (CN)

(*) Notice: Subject to any disclaimer, the term of this patent is extended or adjusted under 35 U.S.C. 154(b) by 386 days.

(21) Appl. No.: 14/002,527

(22) PCT Filed: Mar. 3, 2011

(86) PCT No.: PCT/CN2011/071476
§ 371 (c)(1),
(2), (4) Date: Aug. 30, 2013

(87) PCT Pub. No.: WO2012/116494
PCT Pub. Date: Sep. 7, 2012

(65) Prior Publication Data
US 2013/0335916 A1 Dec. 19, 2013

(51) Int. Cl.
*H02J 7/00* (2006.01)
*H05K 5/00* (2006.01)
*H04M 1/02* (2006.01)
*H01M 2/10* (2006.01)

(52) U.S. Cl.
CPC .......... *H05K 5/0086* (2013.01); *H04M 1/0262* (2013.01); *H01M 2/1022* (2013.01); *H01M 2/1066* (2013.01)

(58) Field of Classification Search
USPC ......................................... 320/107, 112–114
See application file for complete search history.

(56) References Cited

U.S. PATENT DOCUMENTS

2005/0196990 A1 9/2005 Lin
2006/0175840 A1 8/2006 Wang
(Continued)

FOREIGN PATENT DOCUMENTS

CN 101546817 A 9/2009
CN 101604734 A 12/2009
(Continued)

OTHER PUBLICATIONS

International Search Report dated Dec. 15, 2011 from corresponding International Application No. PCT/CN2011/071476.
(Continued)

*Primary Examiner* — Samuel Berhanu
(74) *Attorney, Agent, or Firm* — Wolf, Greenfield & Sacks, P.C.

(57) ABSTRACT

A portable terminal has a main machine body and a cell, one of the main machine body and the cell is arranged a pushing button moving axially, and a compression spring is arranged between the pushing button and the one of the main machine body and the cell, the other has a clamp slot of which a notch extends axially, and the main machine body and the cell is clamped at the axial direction by the pushing button and the clamp slot. The portable terminal also comprises a lock cover connected with the pushing button, and a torsional spring is arranged between the lock cover and the pushing button, so that the lock cover and the pushing button can rotate along the spring-body axis of the torsional spring; when the torsional spring is reset, vertical distance between one end of the lock cover and the cell or the body arranged the compression spring is smaller than the distance that the pushing button inserts into the clamp slot. The lock cover in the present invention can achieve double-clamping at the axial direction for the cell and the main machine body. The pushing button can tightly lock the cell and the main machine body even if the portable terminal is dropped down or impacted. The cell can be taken from the main machine body only by adding certain torque to the torsional spring while in the assembling or disassembling operation, operation is simple and convenient.

12 Claims, 6 Drawing Sheets

(56) References Cited

U.S. PATENT DOCUMENTS

2009/0246610 A1* 10/2009 Shi et al. .................. 429/100
2010/0216005 A1    8/2010 Zeng

FOREIGN PATENT DOCUMENTS

| CN | 201479188 U | 5/2010 |
| CN | 101931671 A | 12/2010 |
| CN | 101958406 A | 1/2011 |
| JP | 07-115654 | 11/1996 |

OTHER PUBLICATIONS

Extended European Search Report dated Nov. 10, 2014 from corresponding Supplementary European Application No. 11859957.

* cited by examiner

PORTABLE TERMINAL

FIELD OF THE INVENTION

The present application relates to the technical field of electronic products, and particularly to a portable terminal.

BACKGROUND OF THE INVENTION

With the rapid development of electronic technology, the application of a portable terminal apparatus has become increasingly wider, for example, in walkie-talkies, mobile phones and other electronic products.

As shown in FIGS. 1, 2 and 3, FIG. 1 is a schematic structural view of a typical portable terminal; FIG. 2 is a schematic partial enlarged view of part A in FIG. 1; and FIG. 3 is a schematic partial enlarged view of part B in FIG. 1.

The portable terminal generally includes two parts: a main machine 11 and a battery 12. Since in use, the battery 12 needs to be detached from the main machine 11 frequently so as to be charged, repaired or replaced, the battery 12 and the main machine 11 are movably connected. Each of the outer side of the top end and the inner side of the tail end of the main machine 11 as shown in FIG. 1 has an engaging groove 111 open to a respective side face, and the main machine 11 has an opening configured to receive the bottom portion of the battery 12. When being mounted, the battery 12 is pushed forwards along an axial direction of the opening from the tail end of the main machine 11, so that the top end of the battery 12 abuts against the top end of the main machine 11. Also, each of both sides of the top end of the battery 12 has a sliding catch (not shown in FIG. 1) engaged with the respective engaging groove 111 at the top end of the main machine 11, and the tail end of the battery 12 also has a sliding catch 121 engaged with the respective engaging groove 111 at the tail end of the main machine 11. Then, after the sliding catch engages with the engaging groove 111, the battery 12 cannot move leftwards and rightwards or upwards and downwards relative to the main machine 11; however, the battery 12 may still exit along the axial direction of the opening from the main machine 11. Thus, a pushing button 13 is further provided. The tail end of the main machine 11 as shown in FIG. 1 has a groove opened upwards, with the pushing button 13 being placed in the groove. The upper portion of the pushing button 13 has a protrusion, and a spring is provided between the pushing button 13 and the bottom portion of the groove. When the spring is not pressed, the protrusion of the pushing button 13 is located above the opening of the groove. The tail end of the battery 12 is provided with a groove opened downwards at the position corresponding to the protrusion. In mounting, the pushing button 13 is pushed downwards, so that the spring is compressed and the protrusion enters within the groove, without limitation to sliding of the battery 12; and after the battery 12 slides into the opening of the main machine 11, the pushing button 13 is released, and is ejected upwards under the elastic force of the spring, so that the protrusion of the pushing button 13 is inserted into the groove of the battery 12, thereby preventing the battery 12 from exiting axially.

However, in the prior art, the pushing button 13 and a spring are primarily adopted for preventing the battery 12 from exiting. Due to the elasticity of the spring, the battery 12 is likely to be loosened, resulting in a poor contact of the electrodes of the battery 12. Moreover, when the portable terminal falls off or is stricken, the spring would be compressed under the gravity of the pushing button 13 or the inertia, and as a result, the pushing button 13 fails so that the battery 12 may exit. Furthermore, in the prior art, only a small segment of sliding catch 121 is adopted, resulting in insufficient stability.

Thus, it is a technical problem to be addressed by the person skilled in the art to provide a portable terminal in which the battery and the main machine may be fixed firmly and assembled and disassembled easily.

SUMMARY OF THE INVENTION

An object of the present application is to provide a portable terminal in which the battery and the main machine body may be fixed firmly so that the battery will not drop off even when the portable terminal encounters situations such as falling off or being stricken, and may be assembled and disassembled easily.

For addressing the above technical problems, the present application provides a portable terminal including a main machine body and a battery. The main machine body has an opening portion for receiving the bottom portion of the battery. The main machine body is engaged with the battery in a transverse direction and a longitudinal direction. One of the main machine body and the battery is provided with a pushing button moveable in the longitudinal direction, with a compression spring (27) being provided therebetween. The other one of the main machine body and the battery is provided with an engaging groove extending in the longitudinal direction. The main machine body and the battery are engaged in an axial direction via the pushing button and the engaging groove. The portable terminal further includes a locking cover connected to the pushing button. A torsion spring is provided between the locking cover and the pushing button, such that the locking cover and the pushing button rotate about the axis of the spring body of the torsion spring. When the torsion spring is returned, the longitudinal distance between one end of the locking cover and the battery or the main machine body provided with the compression spring is less than the distance by which the pushing button is inserted into the engaging groove.

Preferably, the pushing button has an axial protrusion, and the locking cover is hinged with the protrusion by a rotating shaft. The rotating shaft extends transversely through the protrusion, and the spring body of the torsion spring extends throughout the rotating shaft.

Preferably, the locking cover has two clamping arms located at both sides of the protrusion respectively, and the rotating shaft extends through the two clamping arms and the protrusion. The torsion spring is a double torsion spring, and two spring arms located at a side of the double torsion spring are connected to the two clamping arms respectively.

Preferably, each of the both sides of the main machine body has a sliding groove extending axially and opened outwards, and each of the both sides of the battery has a rib engaged in the corresponding sliding groove and sliding in an axial direction of the sliding groove.

Preferably, the sliding grooves are located outside of the both sides of the main machine body, and the ribs are located inside of the both sides of the battery.

Preferably, the battery includes a cell body and a shell for loading the cell body. The shell includes a battery top shell and a battery bottom shell. The battery bottom shell is located in the opening portion, and the rib is located at each of side edges of the battery top shell, and one end of the locking cover abuts against the top portion of the tail end of the battery top shell.

When the portable terminal according to the present application is mounted, a torque may be applied to the torsion spring, so that a force may be applied to one end of the locking cover, and the locking cover may be turned relative to the pushing button. Thus, the longitudinal distance between one end of the locking cover and the battery or the main machine body does not limit the longitudinal movement of the pushing button anymore, and then the pushing button is pushed to compress the compression spring, so that the bottom portion of the battery is allowed to abut against the bottom portion of the main machine body. After the bottom portion of the battery abuts against the bottom portion of the main machine body, the pushing button and the locking cover are released. As a result, on the one hand, the pushing button stretches out under the elastic force of the compression spring to be engaged with the engaging groove of the main machine body or the battery; and on the other hand, the locking cover returns to be in the initial state under the returning action of the torsion spring. Thus, the pushing button cannot exit from the engaging groove and is in the deadlocked state, thereby achieving double axial engagement between the battery and the main machine body. Even when the portable apparatus falls off or is stricken, the pushing button will not exit entirely from the engaging groove, that is, the pushing button may still lock the battery and the main machine body reliably. In disassembling, similarly, the locking cover is returned, and the pushing button is pushed to compress the compression spring, so that the pushing button is disengaged from the engaging groove of the main machine body or the battery. Consequently, the battery may exit from the opening portion of the main machine body.

In a specific embodiment, the outer portion of the pushing button may have an axial protrusion. The locking cover is connected to the protrusion via a torsion spring. A transverse rotating shaft is provided on the protrusion, and the locking cover is hinged with the protrusion via the transverse rotating shaft. Since the protrusion extends by a certain distance in the axial direction, the locking cover is facilitated to be turned about the axis of the spring body of the torsion spring without being limited by other structures. Besides, since the locking cover is hinged with the protrusion via the transverse rotating shaft, the connection of the double torsion spring may be simplified.

In another specific embodiment, the main machine body has a sliding groove located at each of its both outer sides, with the sliding groove being opened outwards, and correspondingly, a rib is provided inside of each of the both sides of the shell of the battery. In mounting, the top end of the battery slides gradually into the opening portion from the tail end of the main machine body, till the top end of the battery and the top end of the main machine body abut against each other. Here, two sides of the battery and two sides of the main machine body are respectively engaged along the whole axial length of the sliding grooves, so that the main machine body and the battery may be fixed firmly in a transverse direction and a longitudinal direction. Furthermore, the engaging groove is located at an outer side of the main machine body, which may prevent the outside dust, moisture or other foreign matters from entering the space between the battery and main machine body, so as to ensure the service performance of the portable terminal apparatus.

DETAILED DESCRIPTION OF THE INVENTION

An object of the present application is to provide a portable terminal in which the battery and the main machine body may be fixed firmly so that the battery will not drop off even when the portable terminal encounters situations such as falling off or being stricken, and may be assembled and disassembled easily.

For those skilled in the art to understand better the technical solutions of the present application, the present application will be further described below in detail in conjunction with the accompanying drawings and the specific embodiments.

Figure 1:
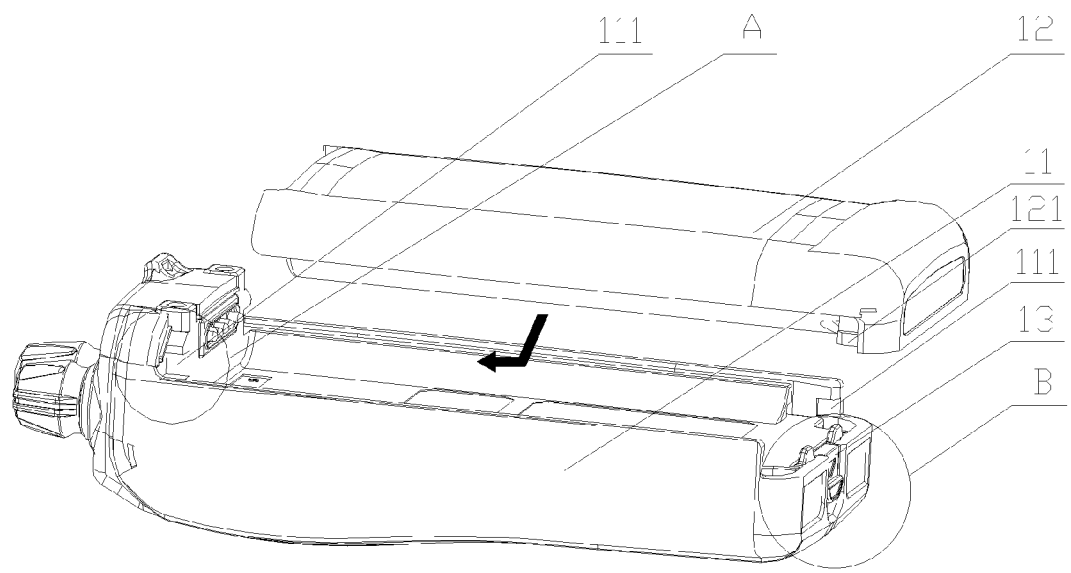
FIG. 1 is a schematic structural view of a typical portable terminal.
Figure 2:
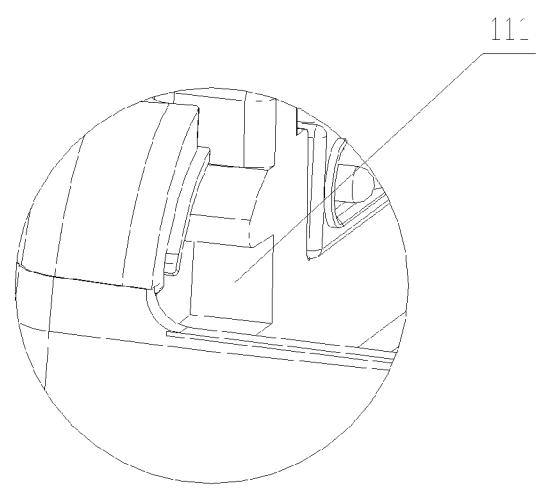
FIG. 2 is a schematic partial enlarged view of part A in FIG. 1.
Figure 3:
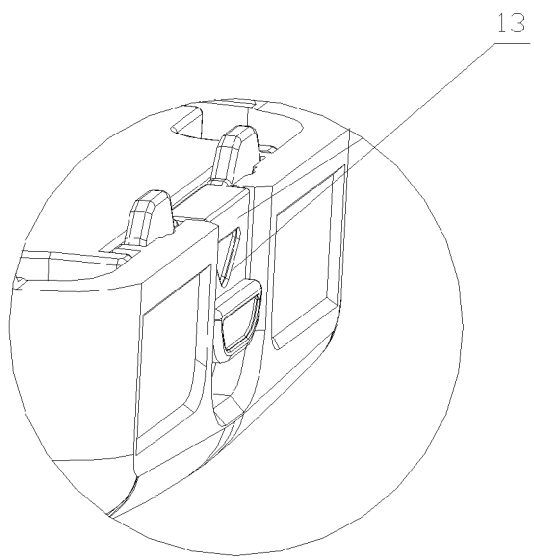
FIG. 3 is a schematic partial enlarged view of part B in FIG. 1.
Figure 4:
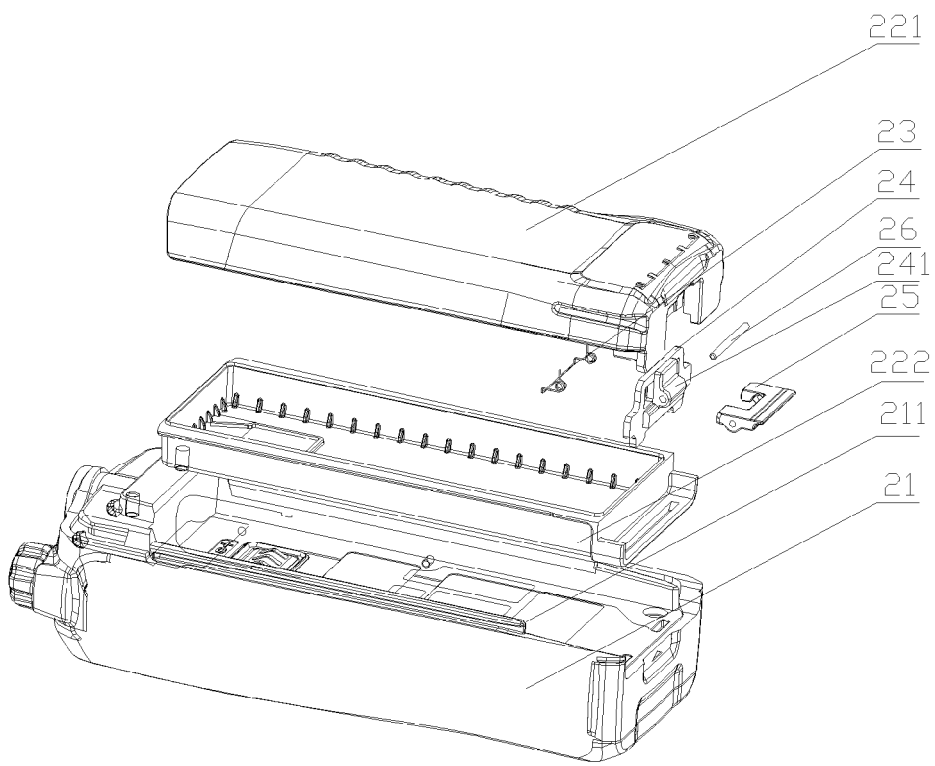
FIG. 4 is a schematic exploded structural view of an assembly of a specific embodiment of a portable terminal according to the present application.
Figure 5:
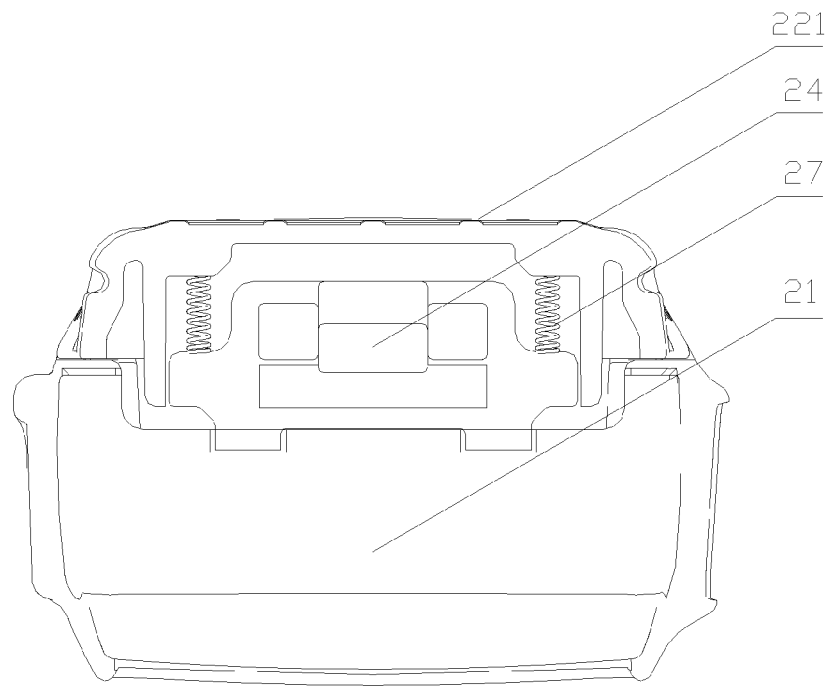
FIG. 5 is a schematic cross-sectional view of the portable terminal shown in FIG. 4.
Figure 6:
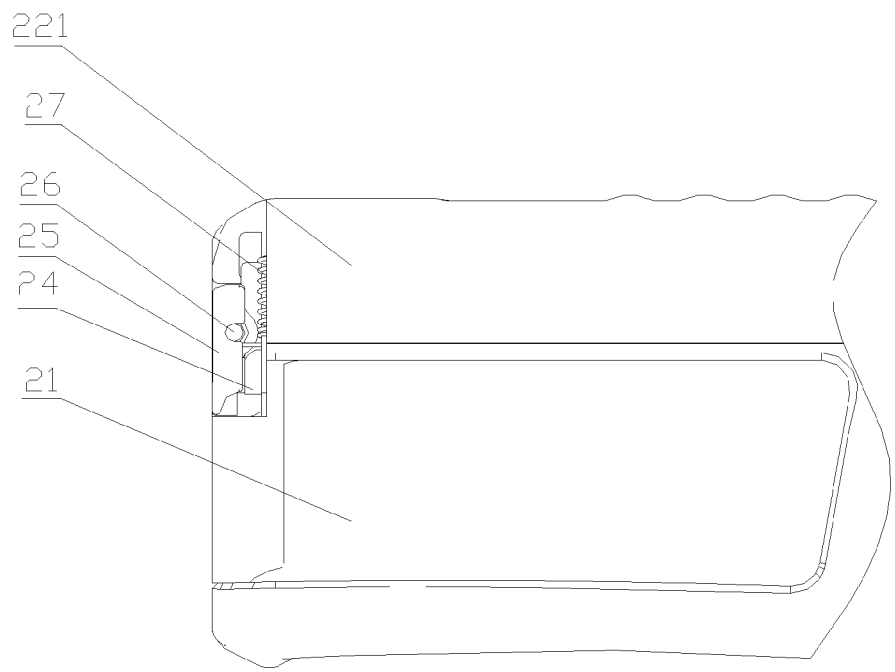
FIG. 6 is a right view showing the tail end of the portable terminal shown in FIG. 4.
Figure 7:
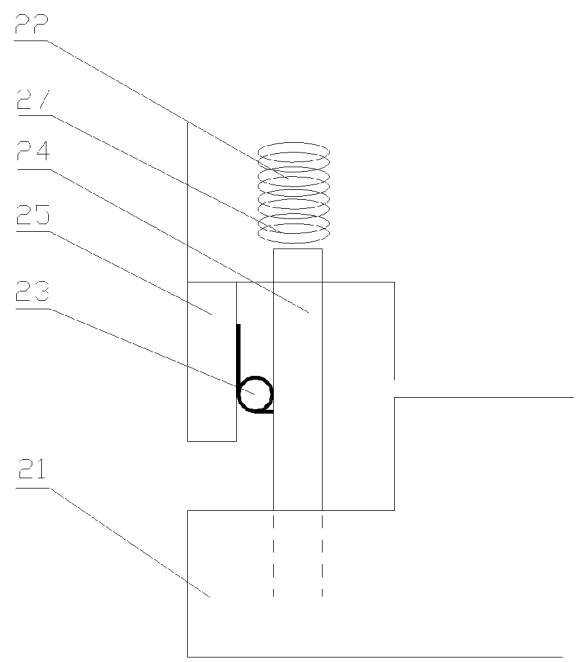
FIG. 7 is a schematic view showing the principle of the structure in FIG. 6.
Figure 8:
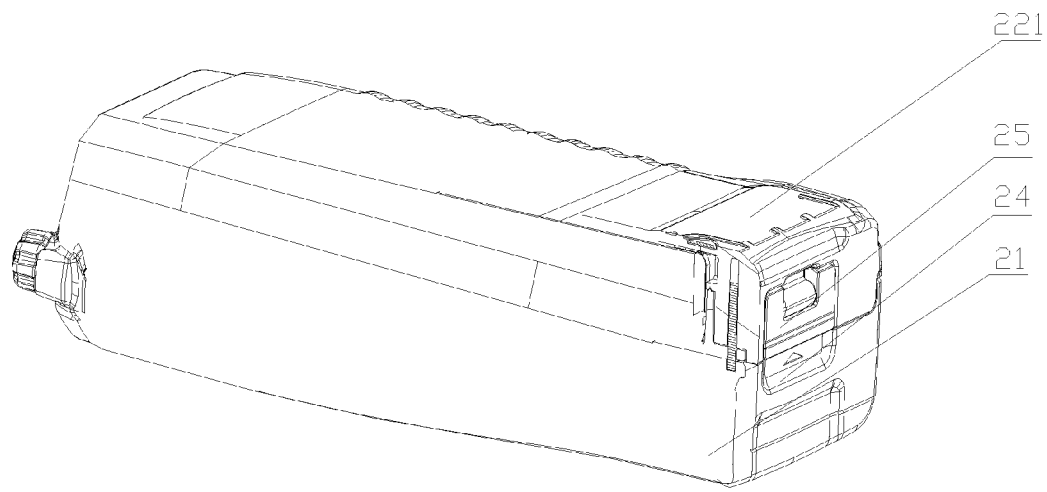
FIG. 8 is a schematic structural view of the portable terminal shown in FIG. 4.

Referring to FIGS. 4 to 8, FIG. 4 is a schematic exploded structural view of an assembly of a specific embodiment of a portable terminal according to the present application; FIG. 5 is a schematic cross-sectional view of the portable terminal shown in FIG. 4; FIG. 6 is a right view showing the tail end of the portable terminal shown in FIG. 4; FIG. 7 is a schematic view showing the principle of the structure in FIG. 6; and FIG. 8 is a schematic structural view of the portable terminal shown in FIG. 4.

A portable terminal according to the present application includes a main machine body 21 and a battery 22. The main machine body 21 has an opening portion for receiving the bottom portion of the battery 22. In the portable terminal shown in FIG. 8, only the bottom portion of the battery 22 is located in the opening portion. The main machine body 21 is engaged with the battery 22 in a transverse direction and a longitudinal direction. The transverse direction is a direction perpendicular to an axial direction of the opening portion in the opening plane of the opening portion, and the longitudinal direction is a direction perpendicular to the opening plane of the opening portion. In the case of respective of FIG. 4, the longitudinal direction is a vertical direction of the portable terminal. For example, an engaging groove open to a respective side face may be machined at each of both sides of the top end and of the tail end of the main machine body 21, and a structure adapted to be inserted into the respective engaging groove may be machined at each of both sides of the top end and of the tail end of the battery 22, so that the battery 22 may be pushed into the opening portion from a rear end of the main machine body 21 and cannot move leftwards and rightwards (transversely), upwards and downwards (longitudinally) relative to the main machine body 21. After the battery 22 is placed into the opening portion, the top end of the battery 22 abuts against the top end of the main machine body 21, so that the battery 22 may exit from the tail end of the main machine body 21 only along the opening portion. The main machine body 21 may be provided with a pushing button 24 moving in the longitudinal direction, and a compression spring 27 is provided between the main machine body 21 and the pushing button 24. The battery 22 may be provided with an engaging groove extending in the longitudinal direction, so that the main machine body 21 is engaged with the battery 22 in the axial direction via the pushing button 24 and the engaging groove. Of course, as shown in FIGS. 5 and 6, the tail end of the battery 21 may have a pushing button 24 moving in the longitudinal direction, and a compression spring 27 may be provided between the battery 21 and the pushing button 24. The lower end of the pushing button 24 may be inserted into the engaging groove of the main machine body 21, so that the battery 22 is incapable of exiting in the axial direction of the opening portion due to the limitation of the pushing button 24. When the battery 22 is disassembled, the pushing button 24 is pushed upwards, and the compression spring 27 is compressed, so that the lower end of the pushing button 24 is disengaged from the engaging groove of the main machine body 21, thereby allowing the axial movement of the battery 22 without the limitation of the pushing button 24. In this way, the battery 22 may exit from the opening portion. In mounting, the pushing button 24 is pushed upwards until the battery 22 is mounted in the opening portion, and then is released, so that the pushing button 24 moves downwards due to the returning action of the compression spring 27 and then the lower portion of the pushing button 24 is engaged in the engaging groove of the tail end of the main machine body 21, causing that the battery 22 is incapable of exiting.

The portable terminal further includes a locking cover 25, with a torsion spring 23 being provided between the locking cover 25 and the pushing button 24. Preferably, the torsion spring 23 is provided between the outer side of the pushing button 24 and the locking cover 25. The outer side of the pushing button 24 is the portion of the pushing button 24 facing outwards after the pushing button 24 is assembled. When a torque is applied to the torsion spring 23, the pushing button 24 may rotate about the axis of the spring body of the torsion spring 23 relative to the locking cover 25; and when the torsion spring 23 is in a return state without being applied with the torque, the longitudinal distance between one end of the locking cover 25 and the battery 22 or the main machine body 21 provided with the compression spring 27 is less than the distance by which the pushing button 24 is inserted into the engaging groove. As shown in FIG. 7, the compression spring 27 is arranged at the tail end of the battery 22, and the upper end of the locking cover 25 abuts against the tail end of the battery 22 when the torsion spring 23 is returned, so that the pushing button 24 connected with the locking cover 25 cannot move upwards. Also, the lower end of the pushing button 24 abuts against the bottom portion of the engaging groove of the main machine body 21, so that the pushing button 24 cannot move downwards. Thus, the pushing button 24 is in a rigid deadlocked state. In fact, it is not necessary that the upper end of the locking cover 25 abuts against the tail end of the battery 22 when the torsion spring 23 is returned, so long as the longitudinal distance between the upper end of the locking cover 25 and the tail end of the battery 22 is less than the distance by which the pushing button 24 is inserted into the engaging groove of the main machine body 21, that is, the pushing button 24 may move upwards by a small distance, but cannot exit from the engaging groove of the main machine body 21.

In mounting, a torque may be applied to the torsion spring 23, so that a force may be applied to one end of the locking cover 25, and the locking cover 25 may be turned relative to the pushing button 24. Thus, the longitudinal distance between one end of the locking cover 25 and the battery 22 or the main machine body 21 does not limit the longitudinal movement of the pushing button 24 anymore, and then the pushing button 24 is pushed to compress the compression spring 27, so that the bottom portion of the battery 22 is allowed to abut against the bottom portion of the main machine body 21. After the bottom portion of the battery 22 abuts against the bottom portion of the main machine body 21, the pushing button 24 and the locking cover 25 are released. As a result, on the one hand, the pushing button 24 stretches out under the elastic force of the compression spring 27 to be engaged with the engaging groove of the main machine body 21 or the battery 22; and on the other hand, the locking cover 25 returns to be in the initial state under the returning action of the torsion spring 23. The locking cover 25 as shown in FIG. 7 abuts against the tail end of the battery 22 again, so that the pushing button 24 cannot move and is in the deadlocked state, thereby achieving double axial engagement between the battery 22 and the main machine body 21. Even when the portable apparatus falls off or is stricken, the pushing button 24 will not exit entirely from the engaging groove, that is, the pushing button 24 may still lock the battery 22 and the main machine body 21 reliably. In disassembling, similarly, the locking cover 25 is returned, and the pushing button 24 is pushed to compress the compression spring 27, so that the pushing button 24 is disengaged from the engaging groove of the main machine body 21 or the battery 22. Consequently, the battery 22 may exit from the opening portion of the main machine body 21.

Figure 9:
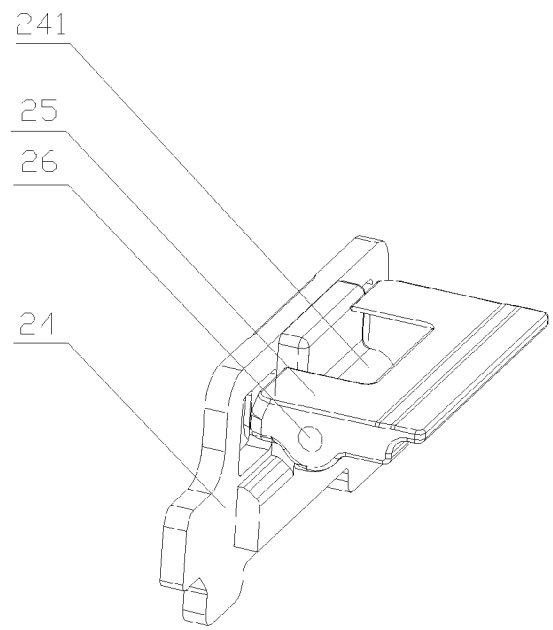
FIG. 9 is a schematic structural view showing the pushing button fitted with the locking cover in another specific embodiment of the portable terminal according to the present application.

Referring to FIG. 9, FIG. 9 is a schematic structural view showing the pushing button fitted with the locking cover in another specific embodiment of the portable terminal according to the present application.

The outer side of the pushing button 24 may be provided with an axial protrusion 241, and the locking cover 25 is connected to the protrusion 241 via a torsion spring 23. Since the protrusion 241 extends by a certain distance in the axial direction, the locking cover 25 is facilitated to be turned about the axis of the spring body of the torsion spring 23 without being limited by other structures. A transverse rotating shaft 26 may further be arranged on the protrusion 241, and the locking cover 25 is hinged with the protrusion 241 by the transverse rotating shaft 26. The double torsion spring 23 may result in simpler connection.

As shown in FIG. 9, the locking cover 25 may have two clamping arms located at both sides of the protrusion 241 respectively, and the rotating shaft 26 passes through the two clamping arms and the protrusion 241. The torsion spring 23 is a double torsion spring. Two spring arms located at a side of the double torsion spring abut against the two clamping arms respectively, and the spring arms on the other side of the double torsion spring are connected to the pushing button 24. As shown in FIG. 4, two axial through holes arranged transversely in parallel may be machined at the middle portion of the pushing button 24, and then the transverse spring arms of the double torsion spring 23 may be located at the inner side of the pushing button 24, and the two spring arms opposing to the transverse spring arms are located at the outer side of the pushing button 24 so as to abut against the two clamping arms of the locking cover 25 located at the outer side of the pushing button 24. Furthermore, the axial through hole facilitates turning the locking cover 25, for example, the locking cover 25 is rotated anticlockwise by 90°. The two spring arms of the locking cover 25 (in the present embodiment, the two spring arms abut against the tail end of the battery 22) may be rotated into the axial through holes of the pushing button 24, and then the locking cover 25 may be pushed upwards, so as to drive the pushing button 24 to compress the compression spring 27 and thus to be disengaged from the engaging groove of the tail end of the main machine body 21. Here, the battery 22 may exit in the axial direction of the opening portion. In mounting, similarly, the locking cover 25 is rotated anticlockwise by 90° and then pushed upwards; and after the battery 22 is mounted into the opening portion, the locking cover 25 is released, so that the pushing button 24 is engaged in the engaging groove. Of course, it is not necessary to rotate the locking cover 25 by 90°. That is, the locking cover 25 may be rotated by any angle, so long as the angle of the rotation enables the locking cover 25 not to abut against the battery 22 or the main machine body 21 and enables the pushing button 24 to be retracted. In the present embodiment, the locking cover 25 may rotate to a large extent, and may also act as a component for urging the pushing button 24, so that the double deadlocked process and the unlocking process may be performed continuously, resulting in easier operation. Furthermore, such a structure may be easily machined without influencing the appearance of the portable terminal.

Each of the both sides of the main machine body 21 may have a sliding groove 211 extending axially and opened outwards, and each of the both sides of the battery 22 may have a rib 2211 mated with the corresponding sliding groove 211, so that the rib 2211 may be engaged in the corresponding sliding groove 211 and may slide in the axial direction of the sliding groove 211. When the battery 22 is mounted, the top end of the battery 22 slides gradually into the opening portion from the tail end of the main machine body 21, till the top end of the battery 22 and the top end of the main machine body 21 abut against each other. Here, both sides of the battery 22 and both sides of the main machine body 21 are respectively engaged along the whole axial length of the sliding grooves 211, so that the main machine body 21 and the battery 22 may be fixed firmly in the transverse direction and the longitudinal direction.

Figure 10:
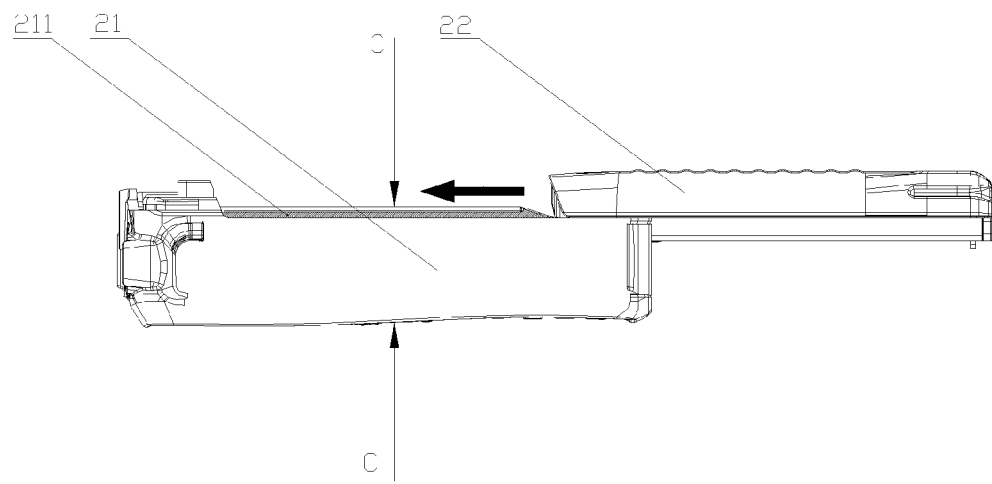
FIG. 10 is a schematic view showing the battery fitted with the main machine body in still another specific embodiment of the portable terminal according to the present application.
Figure 11:
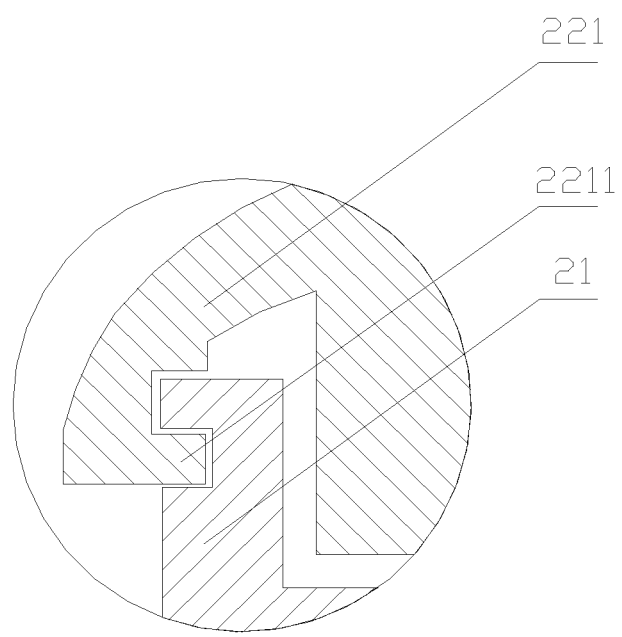
FIG. 11 is a schematic view taken along line C of FIG. 10.

Referring to FIGS. 10 and 11, FIG. 10 is a schematic view showing the battery fitted with the main machine body in still another specific embodiment of the portable terminal according to the present application; and FIG. 11 is a schematic view taken along line C of FIG. 10.

The sliding groove 211 may be located outside of the respective sides of the main machine body 21, and may be opened outwards. Correspondingly, the rib 2211 may be located inside of the respective sides of a shell of the battery 22. Thus, after being assembled, the upper portion of the battery 22 engagingly covers the main machine body 21. Such a structure may prevent the outside dust, moisture or other foreign matters from entering the space between the battery 22 and the main machine body 21, so as to ensure the service performance of the portable terminal apparatus. Alternatively, a sliding groove 211 opened inwards may be provided inside of each of the both sides of the main machine body 21, and correspondingly, the rib 2211 may be located at outside of each of the both sides of the battery 22, thereby also achieving the object of the present application.

The battery 22 may include a cell body and a shell for loading the cell body. The cell body may be referred as a power supply. The shell may include a battery top shell 221 and a battery bottom shell 222. As shown in FIG. 4. In assembling, the battery bottom shell 222 and the battery top shell 221 are engaged and connected together to form an integrated piece, and then slide into the opening portion of the main machine body 21 along the sliding groove 211. After being assembled, the battery bottom shell 222 is located in the opening portion, and the rib 2211 is located at each of side edges of the battery top shell 221, and one end of the locking cover 25 abuts against the tail end of the battery top shell 221.

The portable terminal according to the present application has been described above in detail. In the description, the specific examples are used to elaborate the principle and implementations of the present application. It is noted that the above description of the embodiments is provided only for the purpose of better understanding the method and spirit of the present application. It should be noted that, many improvements and modifications can be made by those skilled in the art without departing from the principle of the present invention, and these improvements and modifications also fall within the scope of protection of the application defined by the claims.

The invention claimed is:

1. A portable terminal, comprising a main machine body and a battery, wherein the main machine body has an opening portion for receiving a bottom portion of the battery and is engaged with the battery in a transverse direction and a longitudinal direction,
   one of the main machine body and the battery is provided with a pushing button moveable in the longitudinal direction, with a compression spring being provided therebetween, and the other one of the main machine body and the battery is provided with an engaging groove extending in the longitudinal direction,
   the main machine body and the battery are engaged in an axial direction via the pushing button and the engaging groove, and
   wherein the portable terminal further comprises a locking cover connected to the pushing button, a torsion spring is provided between the locking cover and the pushing button such that the locking cover and the pushing button rotate about an axis of a spring body of the torsion spring, and
   when the torsion spring is returned, a longitudinal distance between one end of the locking cover and the battery or the main machine body provided with the compression spring is less than a distance by which the pushing button is inserted into the engaging groove.

2. The portable terminal according to claim 1, wherein the pushing button has an axial protrusion, and the locking cover is hinged with the protrusion by a rotating shaft, the rotating shaft extends transversely through the protrusion, and the spring body of the torsion spring extends throughout the rotating shaft.

3. The portable terminal according to claim 2, wherein the locking cover has two clamping arms located at both sides of the protrusion respectively, the rotating shaft extends through the two clamping arms and the protrusion, the torsion spring is a double torsion spring, and two spring arms located at a side of the double torsion spring are connected to the two clamping arms respectively.

4. The portable terminal according to claim 1, wherein each of both sides of the main machine body has a sliding groove extending axially and opened outwards, and each of both sides of the battery has a rib engaged in the corresponding sliding groove and sliding in an axial direction of the sliding groove.

5. The portable terminal according to claim 4, wherein the sliding grooves are located outside of the both sides of the main machine body, and the ribs are located inside of the both sides of the battery.

6. The portable terminal according to claim 5, wherein the battery comprises a cell body and a shell for loading the cell body, the shell comprises a battery top shell and a battery bottom shell, and wherein the battery bottom shell is located in the opening portion, the rib is located at each of side edges of the battery top shell, and one end of the locking cover abuts against a top portion of the tail end of the battery top shell.

7. The portable terminal according to claim 2, wherein each of both sides of the main machine body has a sliding groove extending axially and opened outwards, and each of both sides of the battery has a rib engaged in the corresponding sliding groove and sliding in an axial direction of the sliding groove.

8. The portable terminal according to claim 3, wherein each of both sides of the main machine body has a sliding groove extending axially and opened outwards, and each of both sides of the battery has a rib engaged in the corresponding sliding groove and sliding in an axial direction of the sliding groove.

9. The portable terminal according to claim 7, wherein the sliding grooves are located outside of the both sides of the main machine body, and the ribs are located inside of the both sides of the battery.

10. The portable terminal according to claim 8, wherein the sliding grooves are located outside of the both sides of the main machine body, and the ribs are located inside of the both sides of the battery.

11. The portable terminal according to claim 9, wherein the battery comprises a cell body and a shell for loading the cell body, the shell comprises a battery top shell and a battery bottom shell, and wherein the battery bottom shell is located in the opening portion, the rib is located at each of side edges of the battery top shell, and one end of the locking cover abuts against a top portion of the tail end of the battery top shell.

12. The portable terminal according to claim 10, wherein the battery comprises a cell body and a shell for loading the cell body, the shell comprises a battery top shell and a battery bottom shell, and wherein the battery bottom shell is located in the opening portion, the rib is located at each of side edges of the battery top shell, and one end of the locking cover abuts against a top portion of the tail end of the battery top shell.

* * * * *